United States Patent
Aoki et al.

(10) Patent No.: US 12,334,410 B2
(45) Date of Patent: Jun. 17, 2025

(54) SEMICONDUCTOR DEVICE WITH PROTECTIVE FILM FOR REDUCING ALUMINUM SLIDE IN ALUMINUM WIRING AND MANUFACTURING METHOD THEREOF

(71) Applicant: RENESAS ELECTRONICS CORPORATION, Tokyo (JP)

(72) Inventors: Takashi Aoki, Tokyo (JP); Takehiro Ueda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 311 days.

(21) Appl. No.: 18/057,326

(22) Filed: Nov. 21, 2022

(65) Prior Publication Data

US 2023/0245941 A1    Aug. 3, 2023

(30) Foreign Application Priority Data

Jan. 31, 2022    (JP) .................................. 2022-012760

(51) Int. Cl.
*H01L 23/31* (2006.01)
*H01L 21/02* (2006.01)

(52) U.S. Cl.
CPC ........ *H01L 23/3192* (2013.01); *H01L 21/022* (2013.01); *H01L 23/3171* (2013.01)

(58) Field of Classification Search
CPC .. H01L 23/3192; H01L 21/022; H01L 23/562
USPC .......................................... 257/635
See application file for complete search history.

(56) References Cited

U.S. PATENT DOCUMENTS

| | | | |
|---|---|---|---|
| 9,607,962 B2 | 3/2017 | Saito | |
| 2020/0091100 A1* | 3/2020 | Han | ................ H01L 21/67253 |
| 2021/0280541 A1* | 9/2021 | Choi | ................ H01L 25/0652 |

FOREIGN PATENT DOCUMENTS

| | | |
|---|---|---|
| JP | 62-174957 A | 7/1987 |
| JP | 2015-170778 A | 9/2015 |

* cited by examiner

*Primary Examiner* — Quoc D Hoang
(74) *Attorney, Agent, or Firm* — Rimon P.C.

(57) ABSTRACT

A semiconductor device includes an aluminum layer, a passivation film, and a protective film arranged between the aluminum layer and the passivation film. A plurality of aluminum regions are formed in the aluminum layer. A width of a gap between the adjacent aluminum regions is equal to or less than twice a thickness of the protective film 140. The gap is filled with the protective film 140.

9 Claims, 6 Drawing Sheets

| NUMBER OF SLITS | WIDTH A' (μm) |
|---|---|
| 2 | 9 |
| 3 | 16 |
| 4 | 23 |
| 5 | 30 |

SEMICONDUCTOR DEVICE WITH PROTECTIVE FILM FOR REDUCING ALUMINUM SLIDE IN ALUMINUM WIRING AND MANUFACTURING METHOD THEREOF

CROSS-REFERENCE TO RELATED APPLICATIONS

The present application claims priority from Japanese Patent Application No. 2022-012760 filed on Jan. 31, 2022, the content of which is hereby incorporated by reference to this application.

BACKGROUND

The present invention relates to a semiconductor device and a manufacturing method of the semiconductor device.

As miniaturization of processes advances, performance required for semiconductor devices is increasing. However, a peripheral structure (non-active cell region) of a semiconductor device (e.g., power discrete semiconductor device) undergoes less dimensional reduction due to process upgrades. In particular, a distance between aluminum wirings is designed to be relatively wide in consideration of an amount of aluminum slide regardless of the process updates. The aluminum slide is a phenomenon in which an internal stress occurs due to a difference in a thermal expansion coefficient between a chip and a mold resin in an event involving temperature changes (e.g., temperature cycle), thereby causing aluminum to move.

As a chip thickness is reduced, the mold resin on a top surface of the chip becomes thicker, so that the stress from the mold resin may increase. Therefore, a structure that is resistant to stress changes is required as a peripheral structure of the semiconductor device.

Incidentally, Patent Document 1 (Japanese Patent Application Laid-open No. 2015-170778) discloses a technique of arranging a dummy aluminum in the vicinity of an aluminum pad and coating a space between the aluminums with a silicon oxide film. Further, Patent Document 2 (Japanese Patent Application Laid-Open No. S62-174957) discloses providing a dummy region in a peripheral region of a semiconductor chip.

SUMMARY

A buffer region is provided in a gap between different electrodes in consideration of the amount of aluminum slide. For example, in a temperature cycle test, it is expected that the amount of aluminum slide after 1000 cycles is a certain value or less. The amount of aluminum slide is defined as, for example, 50% or less of a width between the aluminum wirings. The interval between the aluminum wirings of the semiconductor device is designed to have relatively wide dimension in consideration of the regulation. Consequently, there arises a problem about chip sizes becoming large.

Other problems and novel features will be apparent from the description of the present specification and the accompanying drawings.

According to one embodiment, a semiconductor device includes:
an aluminum layer;
a passivation film; and
a protective film arranged between the aluminum layer and the passivation film,
in which a plurality of aluminum regions are formed in the aluminum layer,
a width of a gap between the adjacent aluminum regions is twice or less a thickness of the protective film, and
the gap is filled with the protective film.

According to one embodiment, a manufacturing method of semiconductor device include:
film-forming an aluminum layer;
forming a plurality of aluminum regions in the aluminum layer;
forming a protective film, which has a thickness equal to or more than (½) times a width of a gap between the adjacent aluminum regions, on the aluminum layer forming the plurality of aluminum regions; and
forming a passivation film on the protective film.

According to the one embodiment, shrinking of the chip sizes can be realized.

DETAILED DESCRIPTION

Figure 1:
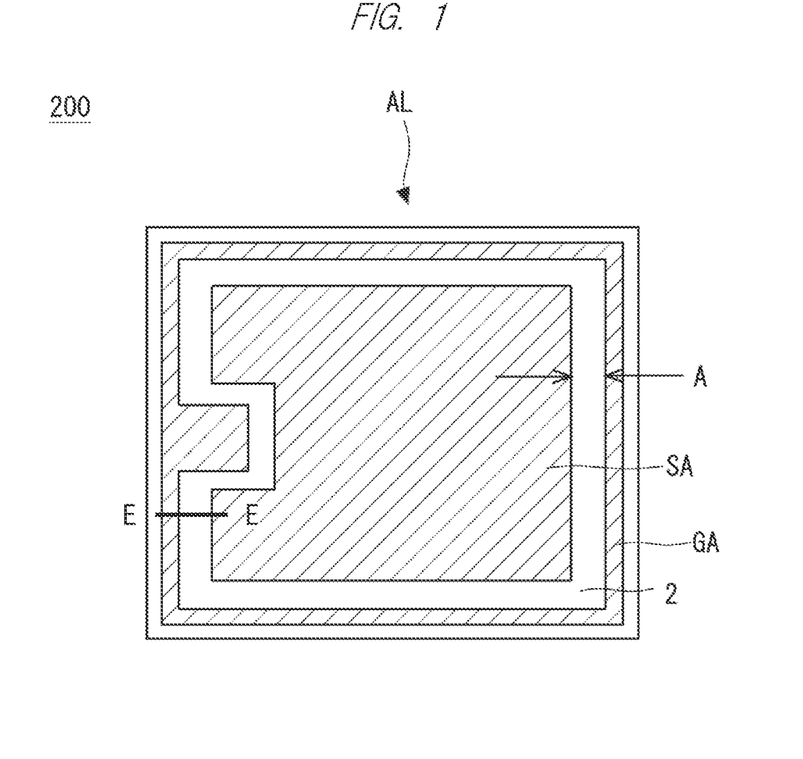
FIG. 1 is a top view showing an aluminum layer of a semiconductor device according to related technology.

First, details of an examination made by the inventors of the present application will be described. FIG. 1 is a schematic top view of an aluminum layer AL (also referred to as an aluminum wiring layer) of a semiconductor device 200 (e.g., semiconductor chip) according to related technology. The aluminum layer of the semiconductor device 200 has a source aluminum electrode SA and a gate aluminum electrode GA. Hereinafter, when the source aluminum electrode SA and the gate aluminum electrode GA are not distinguished from each other, they may simply be referred to as an aluminum electrode or an aluminum wiring. A buffer region 2 is provided between the source aluminum electrode SA and the gate aluminum electrode GA. The reference symbol A indicates a width of the buffer region 2.

As mentioned above, in the temperature cycle test, it is expected that the amount of aluminum slide after 1000 cycles is the certain value or less. The amount of aluminum slide is defined as, for example, 50% or less the width A between the aluminum wirings. Therefore, the width A of the buffer region 2 is designed with the relatively wide dimension in consideration of the regulation. It is desired to reduce dimension of the buffer region 2 and shrink the chip size while inhibiting the aluminum slide.

Figure 2:
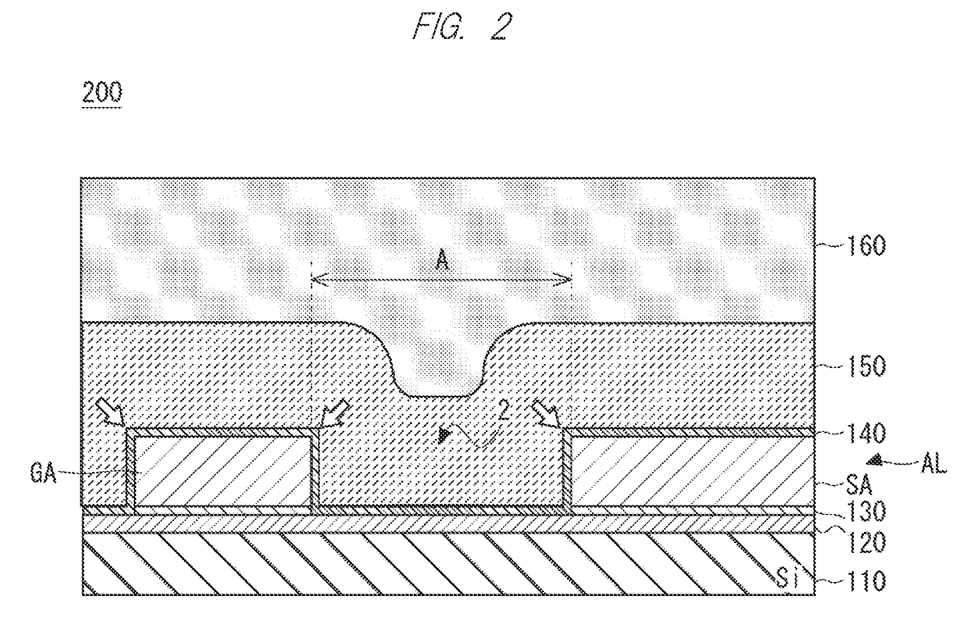
FIG. 2 is a schematic view showing a configuration of the semiconductor device according to the related technology.

FIG. 2 is a schematic view showing a cross-sectional structure of the semiconductor device 200, and includes an E-E cross-sectional view of FIG. 1. The semiconductor device 200 includes a substrate 110 (e.g., silicon substrate), an interlayer film 120, a barrier metal 130, an aluminum layer AL, a protective film 140, a passivation film 150, and a mold resin 160.

A gate aluminum electrode GA and a source aluminum electrode SA are formed in the aluminum layer AL. The protective film 140 is formed on top and side surfaces of each aluminum electrode. In the related technology, a polyimide film may be used as the protective film 140. Three open arrows indicate positions where internal stresses occur when the aluminum slide occurs.

In the related technology, the aluminum electrodes are designed with certain dimension (width A) as an interval between the aluminum wirings. Here, the interval between the aluminum wirings is defined by a distance between the gate aluminum electrode GA and the source aluminum electrode SA.

Figure 3:
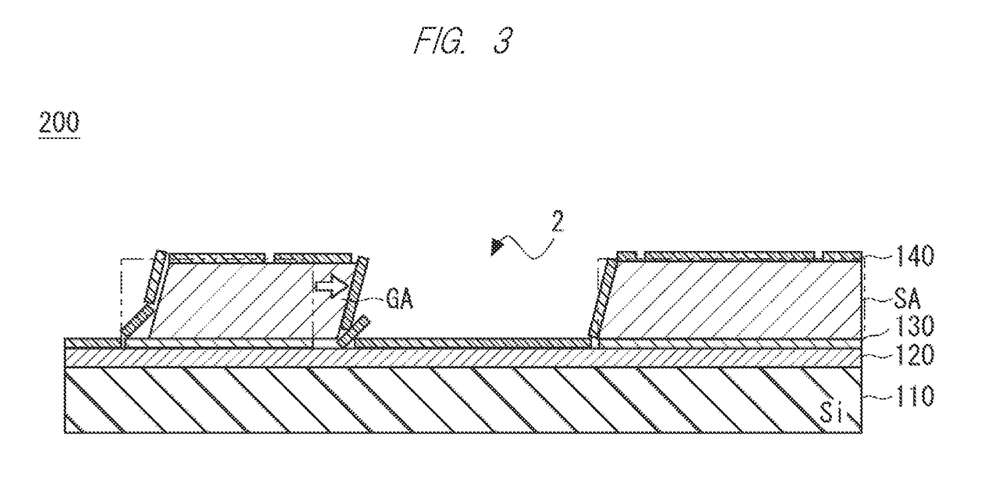
FIG. 3 is a diagram for explaining an outline of an aluminum slide.

FIG. 3 is a schematic view showing a state in which the aluminum slide occurs in the semiconductor device 200 (e.g., a state after the temperature cycle is performed). In FIG. 3, illustration of the passivation film 150 and the mold resin 160 is omitted. The positions of the gate aluminum electrode GA and the source aluminum electrode SA are slid, and the protective film 140 is destroyed. An open arrow indicates a moving direction of the gate aluminum electrode GA. The positions of the gate aluminum electrode GA and the source aluminum electrode SA before sliding are indicated by a dash-single-dot line. In the worst case, the aluminum slide may cause a short circuit between the aluminum electrodes.

The aluminum slide is a phenomenon in which aluminum is deformed under an influence of a stress from the mold resin 160 due to a difference in thermal expansion coefficient between the chip (e.g., silicon substrate 110) and the mold resin 160. Since the aluminum electrodes are easily deformed by an external force, they cannot support an external stress. When the aluminum electrode receives a horizontal force at a center of the chip surface, what supports the force is not the aluminum electrode but the protective film 140 on a surface. When the width of the aluminum electrode is large, the protective film 140 having a low structural strength is destroyed and the aluminum electrode slides.

Therefore, it is considered that the protective film 140 is important in order to inhibit the aluminum slide. Further, it is considered important to flatten a surface of the aluminum layer AL, in other words, to reduce unevenness corresponding to the buffer region 2 and the aluminum electrode in order to inhibit the aluminum slide. Based on the examination mentioned above, the inventors have arrived at an invention leading to embodiments. Hereinafter, the present invention will be described through the embodiments of the invention, but the invention according to the scope of claims is not limited to the following embodiments. Moreover, not all the configurations described in the embodiments are essential as means for solving the problem.

First Embodiment

Figure 4:
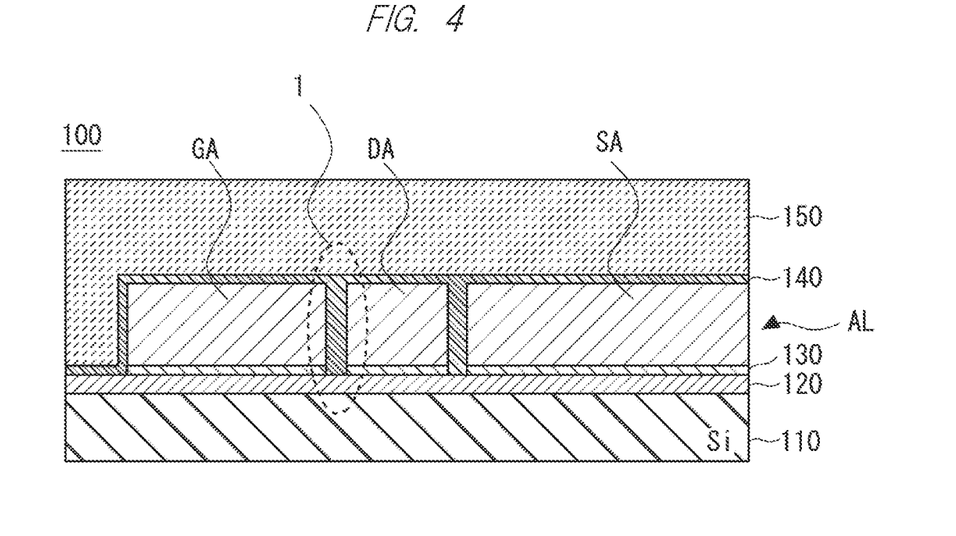
FIG. 4 is a schematic view showing a configuration of a semiconductor device according to a first embodiment.

A configuration of a semiconductor device 100 according to a first embodiment will be described with reference to FIG. 4. FIG. 4 is a schematic view showing a structure of a semiconductor device 100. The semiconductor device 100 shown in FIG. 4 includes a substrate 110, an interlayer film 120, a barrier metal 130, an aluminum layer AL, a protective film 140, and a passivation film 150. In FIG. 4, illustration of the mold resin 160 described above is omitted. The semiconductor device 100 may be, for example, a power discrete semiconductor device.

The interlayer film 120 is formed on the substrate 110 (e.g., silicon substrate). The barrier metal 130 is formed on the interlayer film 120 and covers bottom surfaces of a gate aluminum electrode GA, a dummy aluminum DA, and a source aluminum electrode SA which will be described later.

A gate aluminum electrode GA, a dummy aluminum DA, and a source aluminum electrode SA are formed in the aluminum layer AL. The dummy aluminum DA is also called a dummy aluminum region. The dummy aluminum DA can be used as floating.

Hereinafter, the gate aluminum electrode GA, the dummy aluminum DA, and the source aluminum electrode SA are simply referred to as aluminum regions when they are not distinguished from each other. In addition, when the gate aluminum electrode and the source aluminum electrode are not distinguished from each other, they may simply be referred to as aluminum electrodes. As described above, the bottom surface of each aluminum region is covered with barrier metal 130. Incidentally, the semiconductor device 100 according to the first embodiment has only to include two types of aluminum electrodes (referred to as a first aluminum electrode and a second aluminum electrode), and the two types of aluminum electrodes are not limited to the gate aluminum electrode GA and the source aluminum electrode SA.

The dummy aluminum DA is arranged between the gate aluminum electrode GA and the source aluminum electrode SA. The dummy aluminum DA is adjacent to the gate aluminum electrode GA and the source aluminum electrode.

The reference symbol 1 indicates a gap between the aluminum regions. A width of the gap 1 between the dummy aluminum DA and the gate aluminum electrode GA (e.g., 2 µm or less) is twice or less a thickness of the protective film 140 described later. A width of a gap 1 between the dummy aluminum DA and the source aluminum electrode SA (e.g., 2 µm or less) is twice or less the thickness of the protective film 140 described later. The gap 1 between the aluminum regions is also called an aluminum slit structure.

The gap 1 between the aluminum regions is filled with the protective film 140 described later. The dummy aluminum DA has side surfaces covered with protective films 140 and is electrically insulated from the gate aluminum electrode GA and the source aluminum electrode SA.

The protective film 140 is arranged between the aluminum layer AL and the passivation film 150. The protective film 140 is formed on the gate aluminum electrode GA, dummy aluminum DA, and source aluminum electrode SA. A thickness of the protective film 140 is (½) times or more the width of the gap 1 between the adjacent aluminum regions (e.g., between the gate aluminum electrode GA and the dummy aluminum DA). Therefore, the gap 1 between the aluminum regions is filled with the protective film 140. The protective film 140 may be isotropically formed by CVD (Chemical Vapor Deposition).

Specifically, the protective film 140 may be a nitride film. The nitride film is stiffer than the polyimide film used in the related technology and can improve the resistance to the aluminum slide. The nitride film may be a silicon nitride film (SiN/SiON) generally used in a power MOS (Metal Oxide Semiconductor). Incidentally, from the viewpoint of insulation properties and hardness, an oxide film ($SiO_2$) may be used as the protective film 140 instead of the nitride film.

Incidentally, Patent Document 1 also discloses that the dummy aluminum is coated with the protective film. However, the structure disclosed in Patent Document 1 is significantly different from a structure of the semiconductor device 100.

In Patent Document 1, the dummy aluminum is arranged in the vicinity of the aluminum pad, and a space between the aluminums is covered with a silicon oxide film. A technique disclosed in Patent Document 1 uses HDP-CVD (High Density Plasma-CVD) to form a thick film over a long period of time, which brings a problem of high cost. When the aluminum layer AL is thick (e.g., when the semiconductor device 100 is a power semiconductor), it is difficult to adopt such a structure from the viewpoint of cost. In the semiconductor device 100, for example, P-CVD (Plasma-CVD) is used, and the space between the aluminum regions can be filled with the thin protective film 140. The thickness of the protective film 140 may be, for example, (¼) or less of the thickness of the aluminum layer AL. Patent Document 1 does not disclose specific numerical values for the width between the aluminum regions and for the thickness of the protective film, and does not disclose that the width between the aluminum regions is made twice or less the thickness of the protective film 140.

The description returns to FIG. 4 and is continued. The passivation film 150 is formed on the protective film 140. The passivation film 150 is polyimide, for example. The mold resin 160 (not shown) is molded on the passivation film 150.

Next, one example of a manufacturing method of the semiconductor device 100 according to the first embodiment will be described. First, a substrate 110 provided with an interlayer film 120 is provided. Incidentally, the manufacturing method may include a step of forming an interlayer film on the substrate 110. Next, a barrier metal 130 and an AL layer are film-formed on the provided substrate 110. Next, by etching, a plurality of aluminum regions (e.g., gate aluminum electrode GA, dummy aluminum DA, source aluminum electrode SA) are formed in the aluminum layer AL. Next, a protective film 140 having a thickness equal to or more than (½) times a width of a gap 1 between the adjacent aluminum regions is formed on the aluminum layer AL in which the plurality of aluminum regions are formed. Next, a passivation film 150 is formed on the protective film 140. Finally, a mold resin 160 is molded on the passivation film 150.

Figure 5:
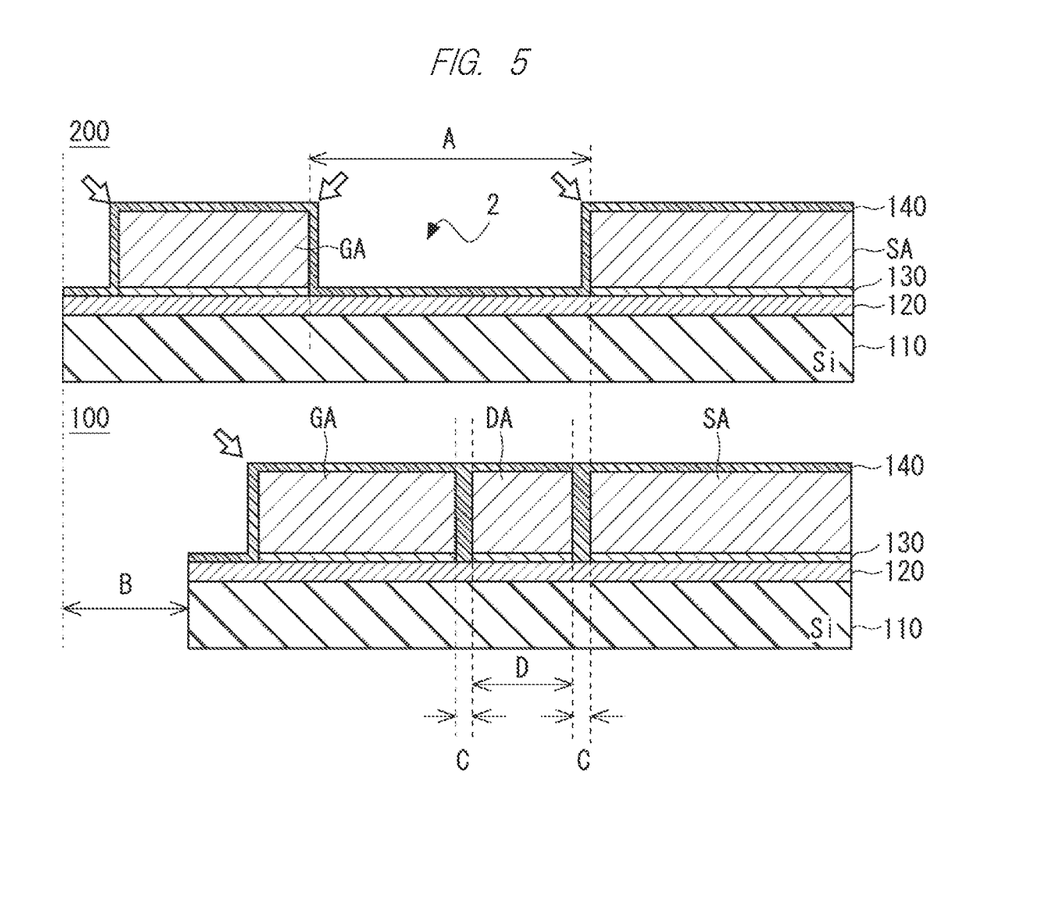
FIG. 5 is a diagram for explaining an effect of the first embodiment.

Next, an effect obtained by the first embodiment will be described with reference to FIG. 5. An upper side of FIG. 5 shows the configuration of the semiconductor device 200 according to the related technology, and a lower side of FIG. 5 shows the configuration of the semiconductor device 100 according to the first embodiment. Between the aluminum electrode GA and the aluminum electrode SA of the semiconductor device 200, a buffer region 2 based on the amount of aluminum slide is provided. When the semiconductor device 200 is a power MOS semiconductor device, the buffer region 2 is generally designed to be ten and several μm or more (e.g., 14 μm or more). The gate aluminum electrode GA and the source aluminum electrode SA operate at different potentials and need to be electrically insulated.

Comparing the semiconductor device 100 according to the first embodiment with the semiconductor device 200 according to the related technology, there is no increase or decrease in the number of diffusion steps, and there is little increase or decrease in manufacturing costs. The gate aluminum electrode GA, dummy aluminum DA, and source aluminum electrode SA are film-formed in the same process and etched in the same process.

In the semiconductor device 100, a dummy aluminum DA is arranged between the aluminum electrode GA and the aluminum electrode SA, and a slit structure (gap 1 described above) is filled with a nitride film (SiO/SiON) or the like. Since the nitride film to be filled in the slit structure and the nitride film to be formed on an upper surface of each aluminum region are formed in the same process, there is no increase or decrease in the number of processes. The reference symbol C indicates a width of the slit structure (gap 1), that is, the width (e.g., 2 μm or less) of the protective film 140 filled between the aluminum regions.

A width D (e.g., 5 μm or less) of the dummy aluminum region is smaller than the width A (e.g., 14 μm or more) of the buffer region 2. This makes it possible to shrink the width between the gate aluminum electrode GA and the source aluminum electrode SA. The reference symbol B indicates a shrink width of the chip (e.g., 5 μm or more).

In addition, in the semiconductor device 100, since the space between the aluminum regions is filled, the protective film 140 becomes flat. Open arrows in FIG. 5 indicate positions where stresses occur. According to the first embodiment, the number of stress-applied points is reduced, and the resistance to the aluminum slide can be improved.

Second Embodiment

Figure 6:
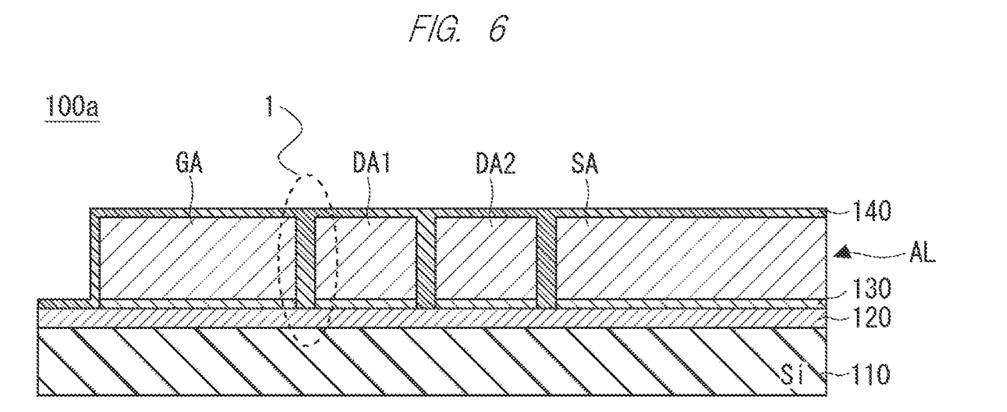
FIG. 6 is a schematic view showing a configuration of a semiconductor device according to a second embodiment.

FIG. 6 is a schematic view showing a configuration of a semiconductor device 100a according to a second embodiment. In the description of the second embodiment, the same reference numerals as those of the first embodiment are given to the same or similar components as or to those of the first embodiment, and a description thereof will be omitted. Incidentally, the illustration of the passivation film 150 is omitted in FIG. 6.

As in the first embodiment, the gate aluminum electrode GA and the source aluminum electrode SA are electrically insulated. The semiconductor device 100 shown in FIG. 4 has two slit structures (gap 1 described above), but the semiconductor device 100a shown in FIG. 6 has three slit structures. By increasing the number of slit structures, electrical insulation between the gate aluminum electrode GA and the source aluminum electrode SA may be ensured.

The semiconductor device 100a includes a gate aluminum electrode GA, dummy aluminum DA1, dummy aluminum DA2, and source aluminum electrode SA. Hereinafter, the dummy aluminum DA1 and the dummy aluminum DA2 may be simply referred to as a dummy aluminum DA when not distinguished from each other.

The dummy aluminum DA1 and the dummy aluminum DA2 are apposed between the gate aluminum electrode GA and the source aluminum electrode SA. The gate aluminum electrode GA and the dummy aluminum electrode DA1 are adjacent, the dummy aluminum DA1 and the dummy aluminum DA2 are adjacent, and the dummy aluminum DA2 and the source aluminum electrode DA2 are adjacent. The width of the gap 1 between the adjacent aluminum regions is equal to or less than twice the thickness of the protective film 140.

Incidentally, although the semiconductor device 100a shown in FIG. 6 includes the two dummy aluminums DA, the semiconductor device according to the second embodiment may include three or more dummy aluminums DA. If the number of dummy aluminums DA is 3, the number of slit structures is 4 and if the number of dummy aluminums DA is 4, the number of slit structures is 5. When the slit structures are filled with a nitride film or an oxide film, insulation properties between the gate aluminum electrode AL and the source aluminum electrode SL are improved as the number of slit structures increases.

The semiconductor device according to the second embodiment also has the same effect as that of the first embodiment. Since the semiconductor device according to the second embodiment includes the plurality of dummy aluminums and includes three or more slit structures, the insulation properties between the aluminum electrodes can be further improved.

Third Embodiment

Figure 7:
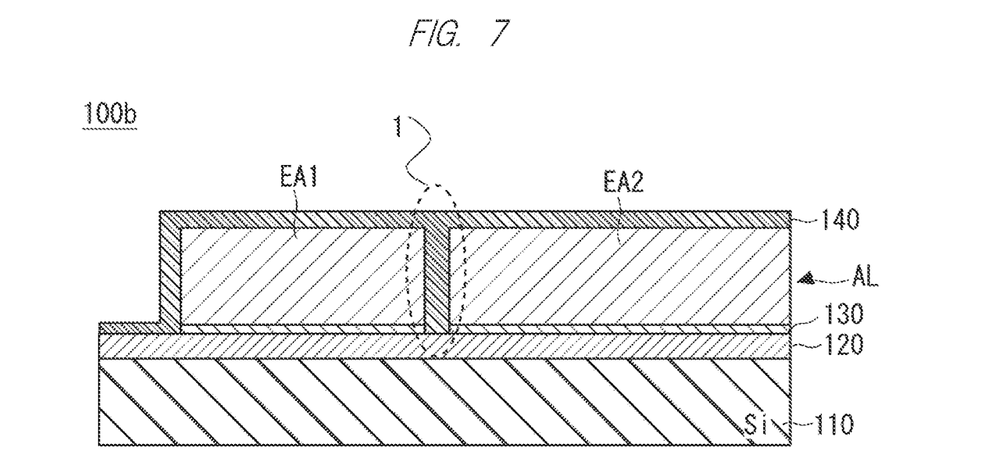
FIG. 7 is a schematic view showing a configuration of a semiconductor device according to a third embodiment.

FIG. 7 is a schematic view showing a configuration of a semiconductor device 100b according to a third embodiment. In the description of the third embodiment, the same reference numerals as those in the first and second embodiments are given to the same or similar constituent elements as or to those in the first and second embodiments, and a description thereof will be omitted. Incidentally, also in FIG. 7, the illustration of the passivation film 150 is omitted as in the second embodiment.

Comparing the semiconductor device 100b shown in FIG. 7 and the semiconductor device 100 shown in FIG. 4, the gate aluminum electrode GA and the source aluminum electrode SA are replaced with aluminum electrodes EA1 and EA2. Specific examples of the aluminum electrodes EA1 and EA2 will be described later. Also, the semiconductor device 100b shown in FIG. 7 does not have a dummy aluminum DA.

The aluminum electrode EA1 and the aluminum electrode EA2 are adjacent to each other. Hereinafter, when the aluminum electrode EA1 and the aluminum electrode EA2 are not distinguished from each other, they may simply be referred to as an aluminum electrode EA. The aluminum electrodes EA1 and EA2 operate at the same potential. Alternatively, a potential difference between the aluminum electrode EA1 and the aluminum electrode EA2 is small. In such a case, sufficient insulation properties can be ensured by arranging one slit structure (gap 1) between the aluminum electrode EA1 and the aluminum electrode EA2.

The semiconductor device 100b according to the third embodiment also has the same effect as that of the first embodiment. In the third embodiment, the dummy aluminum DA does not need to be formed. The width between the aluminum electrodes is, for example, 2 μm or less.

Finally, specific examples of the aluminum electrodes EA1 and EA2 will be described. For example, the aluminum electrode EA1 may be an electrode having the same potential as a source potential of a main MOS, and the aluminum electrode EA2 may be an electrode having the same potential as a source potential of a sense MOS. It is assumed that the main MOS and the sense MOS are mixedly mounted on the semiconductor device 100b. A size of the main MOS is large, and a size of the sense MOS is small. A gate terminal and a drain terminal are common to both, and the both operate at the same timing. Both source electrodes thereof are driven independently from each other, but are generally driven at the same potential.

Further, the aluminum electrode EA1 may be an aluminum wiring for being connected to a sense terminal (voltage detection terminal) of the sense MOS, and the aluminum electrode EA2 may be an aluminum wiring for being connected to a force terminal (power transmission terminal) of the sense MOS. The both are branched from a source aluminum of the sense MOS and connected to the aluminum wiring, and have the same potential.

Furthermore, the aluminum electrode EA1 may be an aluminum wiring for being connected to a source Kelvin terminal of the main MOS, and the aluminum electrode EA2 may be a source aluminum electrode of the main MOS. Since the source Kelvin terminal and the source aluminum electrode are connected by aluminum, they have almost the same potential.

Incidentally, the electrodes EA1 and EA2 do not need to have the same potential. A difference between a potential of the electrode EA1 and a potential of the electrode EA2 has only to be made small enough to ensure the insulation properties between the electrode EA1 and the electrode EA2 by a single slit structure.

Fourth Embodiment

Figure 8:
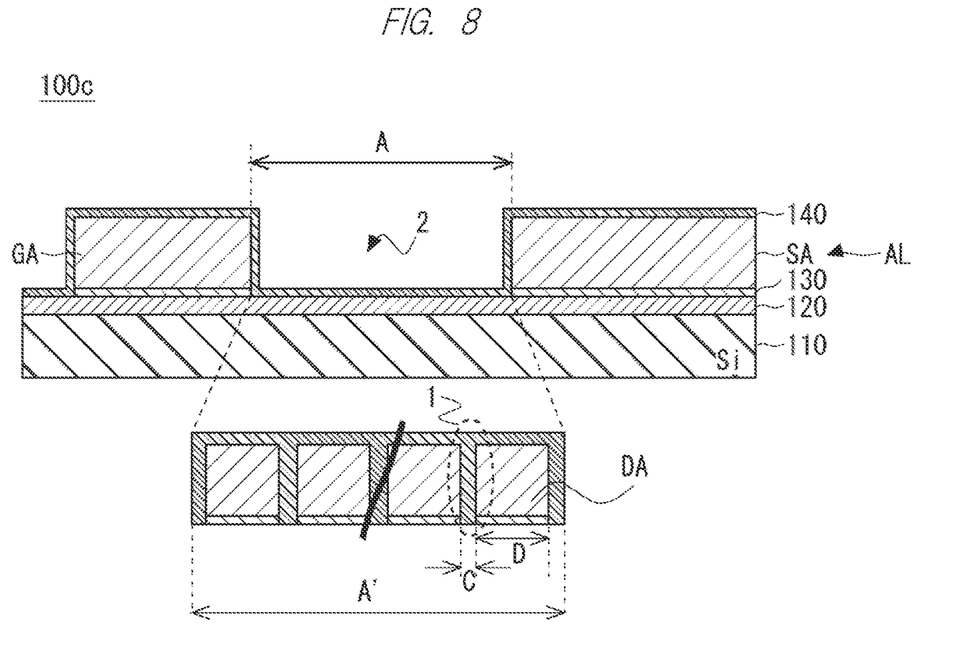
FIG. 8 is a schematic view showing a configuration of a semiconductor device according to a fourth embodiment.

FIG. 8 is a schematic view showing an outline of a semiconductor device 100c according to a fourth embodiment. In the description of the fourth embodiment, the same reference numerals as those in the first to third embodiments are given to the same or similar constituent elements as or to those in the first to third embodiments, and a description thereof will be omitted.

The semiconductor device 100a according to the second embodiment described above has the plurality of dummy aluminums DA arranged in the buffer region 2 and ensures the insulation properties between the gate aluminum electrode GA and the source aluminum electrode SA. At this time, a width A' between the gate aluminum electrode GA and the source aluminum electrode SA may become larger than the original width A of the buffer region 2 depending on the number of dummy aluminums DA to be added.

A semiconductor device 100c according to a fourth embodiment has a hybrid structure in which both a portion including the slit structure (gap 1) and a portion not including the slit structure are mixedly mounted. The semiconductor device 100c includes both of a gap 1 having a width equal to or less than twice the thickness of the protective film 140 and a buffer region 2 having a width equal to or more than twice the thickness of the protective film 140. The gate aluminum electrode GA and the source aluminum electrode SA sandwiching the buffer region 2 are also referred to as a third aluminum electrode and a fourth aluminum electrode. In other words, the buffer region 2 is provided between the third aluminum electrode and the fourth aluminum electrode in consideration of the amount of aluminum slide.

Figure 9:
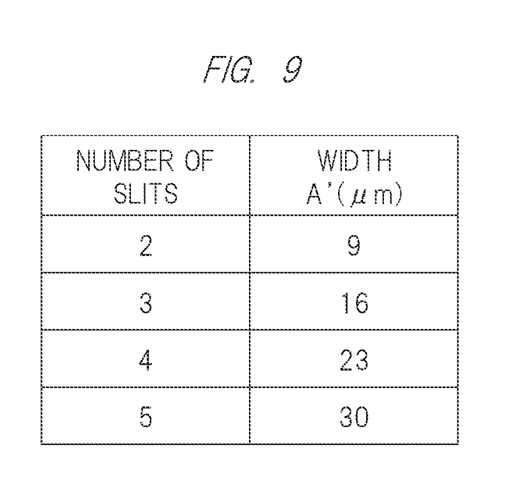
FIG. 9 is a diagram for explaining a relationship between the number of slits and a width of aluminum electrode.

FIG. 9 is a table showing a relationship between the number of slit structures (also referred to as the number of slits) and the width A'. A width C of the gap 1 between the aluminum regions shown in FIG. 8 is assumed to be 2 μm, and a width D of the dummy aluminum DA is assumed to be 5 μm. Returning to FIG. 9, if the number of slit structures is 2, the width A' is 9 μm. If the number of slit structures is 3, the width A' is 16 μm. If the number of slit structures is 4, the width A' is 23 μm. If the number of slit structures is 5, the width A' is 30 μm. For example, the dummy aluminum DA may be provided only when the width A' is smaller than the width A of the buffer region 2 in the related technology.

The semiconductor device 100c according to the fourth embodiment also has the same effect as that of the first embodiment. According to the fourth embodiment, the number of dummy aluminums can be appropriately set.

The invention made by the present inventors has been specifically described above based on the embodiments, but the present invention is not limited to the above embodiments and, needless to say, can be variously modified within a range not departing from the scope of the invention.

What is claimed is:

1. A semiconductor device comprising:
   an aluminum layer;
   a passivation film; and
   a protective film arranged between the aluminum layer and the passivation film,
   wherein the aluminum layer includes a plurality of aluminum regions,
   wherein the protective film includes portions that are respectively formed on the aluminum regions,
   wherein a width of a gap between the adjacent aluminum regions is equal to or less than twice a thickness of the portions of the protective film, and
   wherein the gap is filled with the protective film.

2. The semiconductor device according to claim 1, wherein the protective film is a nitride film or an oxide film.

3. The semiconductor device according to claim 1, wherein the plurality of aluminum regions include a first aluminum electrode, a second aluminum electrode, and a dummy aluminum region arranged between the first aluminum electrode and the second aluminum electrode.

4. The semiconductor device according to claim 1, wherein the plurality of aluminum regions include a first aluminum electrode, a second aluminum electrode, and a plurality of dummy aluminum regions apposed between the first aluminum electrode and the second aluminum electrode.

5. The semiconductor device according to claim 1, wherein the plurality of aluminum regions include two adjacent aluminum electrodes.

6. The semiconductor device according to claim 1,
   wherein a third aluminum electrode and a fourth aluminum electrode are formed in the aluminum layer besides the plurality of aluminum regions, and
   wherein a buffer region is provided between the third aluminum electrode and the fourth aluminum electrode in consideration of an amount of aluminum slide.

7. The semiconductor device according to claim 1, wherein the thickness of the portions of the protective film is equal to or less than ($\frac{1}{4}$) times a thickness of the aluminum layer.

8. A manufacturing method of semiconductor device, comprising:
   filming-forming an aluminum layer;
   forming a plurality of aluminum regions in the aluminum layer;
   forming, on the aluminum layer, a protective film, having portions that are respectively formed on the aluminum regions, the portions of the protective film having a thickness equal to or more than ($\frac{1}{2}$) times a width of a gap between the adjacent aluminum regions; and
   forming a passivation film on the protective film.

9. The manufacturing method of semiconductor device according to claim 8, wherein the protective film is a nitride film or an oxide film.

* * * * *